(12) United States Patent
Schoeppach et al.

(10) Patent No.: US 8,339,569 B2
(45) Date of Patent: Dec. 25, 2012

(54) TEMPERATURE-CONTROL DEVICE FOR AN OPTICAL ASSEMBLY

(75) Inventors: Armin Schoeppach, Aalen (DE); Timo Laufer, Stuttgart (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 148 days.

(21) Appl. No.: 13/049,703

(22) Filed: Mar. 16, 2011

(65) Prior Publication Data

US 2011/0181851 A1 Jul. 28, 2011

Related U.S. Application Data

(63) Continuation of application No. PCT/EP2009/006638, filed on Sep. 14, 2008.

(60) Provisional application No. 61/098,259, filed on Sep. 19, 2008.

(30) Foreign Application Priority Data

Sep. 19, 2008 (DE) .................... 10 2008 042 215

(51) Int. Cl.
G03B 27/52 (2006.01)
G03B 27/42 (2006.01)
(52) U.S. Cl. .......................................... 355/30; 355/53
(58) Field of Classification Search .............. 355/30, 355/53, 67, 818–820
See application file for complete search history.

(56) References Cited

U.S. PATENT DOCUMENTS

| 4,253,739 | A | 3/1981 | Carlson |
| 5,390,228 | A | 2/1995 | Niibe et al. |
| 6,750,949 | B2 | 6/2004 | Loopstra et al. |
| 7,102,727 | B2 * | 9/2006 | Hara ............................ 355/30 |
| 7,158,209 | B2 * | 1/2007 | Hara ............................ 355/30 |
| 7,397,531 | B2 * | 7/2008 | Franken ...................... 355/30 |
| 2004/0174504 | A1 | 9/2004 | Hara et al. |
| 2004/0227913 | A1 | 11/2004 | Kino |
| 2005/0002434 | A1 | 1/2005 | Armier et al. |
| 2007/0076310 | A1 | 4/2007 | Sakino et al. |
| 2010/0157270 | A1 | 6/2010 | Muehlbeyer et al. |

FOREIGN PATENT DOCUMENTS

DE 101 34 387 A 1/2003

(Continued)

OTHER PUBLICATIONS

The International Search Report and Written Opinion for the corresponding PCT Application No. PCT/EP2009/006638, mailed, Dec. 14, 2009.

(Continued)

*Primary Examiner* — Hung Henry Nguyen
(74) *Attorney, Agent, or Firm* — Fish & Richardson P.C.

(57) ABSTRACT

A temperature-control device is used for controlling the temperature of an optical assembly with at least one optical body, the temperature of which is to be controlled, with at least one optical surface which can be acted upon by a heat flow. The temperature-control device has a heat sink to receive a heat flow, which is emitted by the optical body or a transmission body which is in thermal connection with the optical body. The heat sink is arranged adjacent to a peripheral region of the optical surface. The temperature-control device has a heating mechanism with at least one heating body, which is arranged adjacent to the optical body. The heating body is connected via a physical heat bridge to the heat sink.

15 Claims, 3 Drawing Sheets

FOREIGN PATENT DOCUMENTS

| | | |
|---|---|---|
| DE | 102 01 334 A1 | 8/2003 |
| EP | 0 678 768 A2 | 10/1995 |
| EP | 1 197 776 A | 4/2002 |
| EP | 1 387 054 A | 2/2004 |
| GB | 1 201 607 A | 8/1970 |
| WO | WO 2005/026801 A | 3/2005 |

OTHER PUBLICATIONS

German Examination Report, with English translation, for corresponding DE Application No. 10 2008 042 215.0, dated May 20, 2009.

* cited by examiner

TEMPERATURE-CONTROL DEVICE FOR AN OPTICAL ASSEMBLY

CROSS-REFERENCE TO RELATED APPLICATIONS

This application is a continuation of, and claims benefit under 35 USC 120 to, international application PCT/EP2009/006638, filed Sep. 14, 2009, which claims benefit of German Application No. 10 2008 042 215.0, filed Sep. 19, 2008 and U.S. Ser. No. 61/098,259, filed Sep. 19, 2008. International application PCT/EP2009/006638 is hereby incorporated by reference in its entirety.

BACKGROUND

The disclosure relates to a temperature-control device for an optical assembly with at least one optical body, the temperature of which is to be controlled, with at least one optical surface which can be acted upon by a heat flow and in particular with useful radiation. Furthermore, the disclosure relates to an optical assembly with a temperature-control device of this type, an illumination optics with an optical assembly of this type, a projection optics with an optical assembly of this type and a projection exposure apparatus with an illumination optics of this type or with a projection optics of this type.

A temperature-control device of the type mentioned at the outset is known from U.S. Pat. No. 7,102,727 B2.

SUMMARY

A temperature-control device for an optical assembly with at least one optical body is disclosed for which a predetermined temperature control of the optical body is used to minimise optical errors, caused by a thermo-elastic deformation of the optical body, in particular the optical surface, and is possible with low outlay.

In one aspect, the invention features a temperature-control device for an optical assembly with at least one optical body of which the temperature is to be controlled, with at least one optical surface to be acted upon by a heat flow,
  with a heat sink to receive a heat flow, which is emitted from the optical body or a transmission body in thermal connection with the optical body,
  wherein the heat sink is arranged adjacent to a peripheral region of the optical surface,
  with a heating mechanism to correct deformations of the optical body with at least one heating body, which is arranged adjacent to the optical body,
  wherein the heating body is connected to the heat sink using a physical heat bridge and has a temperature, which is greater than or equal to the temperature of the heat sink.

In general, the heat sink has two functions: on the one hand, the heat sink is used for thermal stabilisation of the optical body. The optical body can efficiently discharge heat, which is introduced therein, in particular by residual absorption, to the heat sink. On the other hand, the heat sink is used to discharge heat energy from the heating body via the physical heat bridge. The temperature of the heating body or a temperature profile thereon can thus be adjusted with small reaction times to a specified value, as excess heat can be discharged via the heat bridge. The resulting temperature-control device, in comparison to U.S. Pat. No. 7,102,727 B2 manages with a lower number of thermal bodies to be regulated. The heat sink merely has to be kept at a constant temperature in the temperature-control device according to the disclosure and this is possible with structurally simple means. In particular when the optical assembly, as described in DE 101 34 387 A, is constructed with a load-removing structure and a measuring structure, the load-removing structure can be configured as a heat sink. An occurring or changing thermal load on the optical body is compensated via the heating body. For this purpose, a predetermined temperature or a predetermined temperature profile of the heating body to react to a thermal load detected by sensor, for example, with a low reaction time, can be specified in such a way that an efficient compensation of the radiation-induced thermal load is ensured. A heat source producing the heat flow and acting on the optical body may, in particular, be a residual absorption of the useful radiation. Alternatively or additionally, other heat sources may act on the optical body and lead to a heat flow action on the surface of the optical body independently of a useful radiation residual absorption. The surface of the optical body which can be acted upon by the heat flow may be an optical surface thereof. Alternatively, correction of mirror deformations may take place with the temperature-control device, these being caused by a heat flow, which acts upon a surface other than the optical surface of the optical body. Examples of heat sources independent of a useful radiation residual absorption are actuators or sensors which cooperate with the optical body. The heating body may be arranged, in relation to the surface of the optical body which can be acted upon by the heat flow, on a side of the optical body opposing this surface. If the optical body is configured as a mirror, the heating body may be arranged adjacent to a rear side of the mirror. A spacing of the heating body from the optical body may be in the range between 0.5 mm and 5 cm. If a heat flow impingement does not take place via the optical surface of the optical body, the heating body may in turn be arranged on the side of the mirror body opposing this surface acted upon by the heat flow. The heating body may be arranged in such a way that it does not, or at most minimally, disrupts a beam path of the useful radiation to be guided with the optical body. The term "heating body" relates to the fact that the temperature of the heating body has a temperature, which is greater than or equal to the temperature of the heat sink. In relation to the optical body, the heating body may nevertheless be a cooling body if the optical body on the side facing the heating body has a higher temperature than the heating body. With the heating body a heat flow from the heating body to the optical body may be controlled or regulated using a temperature difference between said heating body and the side of the optical body facing the heating body in such a way that the heat flow may be negative or positive. A negative heat flow in this case means that the heating body has a lower temperature than the optical body. A positive heat flow means that the heating body has a higher temperature than the optical body. A ratio between a diameter of the optical body and a thickness of the optical body perpendicular to an optical surface thereof may be 5. Other ratios between the periphery and the thickness in the range between 1 and 10, in the range between 2 and 8, in the range between 3 and 7, in the range between 4 and 6 or in the range between 4.5 and 5.5 are possible. The temperature-control device may completely dispense with the use of an active cooling device, in other words the use of an actively cooled body.

The heat bridge may be configured by at least one connecting web between the heating body and the heat sink. The connecting web may simultaneously be used as a mechanical holder of the heating body on the heat sink.

A cross-sectional surface of the connecting web, which is greater than 1 mm$^2$, and a material selection of the at least one connecting web from aluminum, steel, invar or a ceramic composite material have proven to be particularly suitable for the design of the heat bridge implemented with the connecting web. In principle, smaller cross-sectional surfaces may also be used. An example of a ceramic composite material to produce the connecting web is C/CSiC.

The heating mechanism may have a regulating mechanism for specifying a temperature profile via the heating body. The temperature profile may, in particular, be specified in a spatial and time constant manner. Alternatively, a spatial and/or a time variation of the temperature profile, predetermined by the regulating mechanism are also possible. A sensor signal of a sensor for measuring the quality of the useful radiation reflection of the reflection surface may be used as an input signal of the regulating mechanism.

The heating body may have a heating foil. A heating foil allows a very sensitive metering of the heat energy introduced into the heating body. In addition, the heating foil may also be structured in design, so depending on the symmetry to be expected of the heat introduction to be compensated in the optical body, a corresponding symmetry of the heat introduction can be achieved through the heating foil.

The heating body may be heated and/or cooled in portions. In this manner, an exact specification of a temperature profile is also possible with higher amplitudes between a minimum and a maximum temperature of the heating body. Temperature differences between this minimum and maximum temperature in the region of one degree or else still higher temperature differences are possible.

The heating body may be kept at a predetermined temperature in portions. In this case, a regulation of a temperature control of the heating body may take place such that the latter is heated or cooled depending on the temperature of the heating body portion in question to achieve the predetermined temperature.

A heat sink, which is in signal connection with a regulating mechanism to specify a constant temperature of the heat sink, ensures a stable thermal behaviour of the heat sink.

A holding structure for mounting the optical body, with the heat transmission of the holding structure being smaller than the heat transmission through the heat bridge between the heating body and the heat sink in such a way that in the interaction of the heat transmissions via the holding structure, on the one hand, and via the heat bridge, on the other hand, with regard to a regulation of a temperature of the heating body and a heating energy required to maintain a temperature to be regulated, an efficiency optimum is adjusted, avoids a disruptive direct heat bridge undesirably being produced between the mirror and the heat sink. Symmetry disruptions of the temperature profile of the optical body because of a thermal compensation via the holding structure are then avoided.

The at least one optical surface may be arranged in a gas atmosphere. This increases the achievable heat transfer between the optical body and the heat sink, on the one hand, and the optical body and the heating mechanism, on the other hand, as the heat transfer does not take place exclusively by heat radiation.

The optical body may be configured as a mirror, the heating mechanism being arranged adjacent to a rear side of the mirror remote from the optical surface of the mirror, in other words the reflection surface. A thermal compensation can then elegantly be achieved from the rear side of the mirror. The mirror is preferably thin between the optical surface and the rear side, so a temperature profile impressed on the rear side via the heating mechanism is converted practically undisturbed into a corresponding temperature profile of the optical surface. This facilitates the compensation of temperature profiles, which are produced on the optical surface.

The advantages of an optical assembly with a temperature-control device, an illumination optics with an optical assembly, a projection optics with an optical assembly and a projection exposure apparatus with an illumination optics and/or a projection optics correspond to those which were already described above with reference to the temperature-control device.

Embodiments feature a method for the compensation of heat-induced deformations of an optical surface of an optical body using the temperature-control device.

In certain aspects, the invention features a method for compensating heat-induced deformations of an optical surface of an optical body with at least one surface which can be acted upon with a heat flow, using a temperature-control device according the aforementioned aspects, the method including the following steps:
  measuring the heat flow, with which the surface of the optical body is acted upon and/or measuring a temperature on the surface acted upon by the heat flow and/or at a predefined position on the optical body,
  setting a temperature of the heating body of the heating mechanism, which is greater than or equal to the temperature of the heat sink.

It was recognised that it may be sufficient, depending on the heat flow acted upon by the optical body, to set or specify the temperature of an additional heating body, it only having to be taken into account as the single boundary condition that the temperature of the heating body is greater than or equal to the temperature of the heat sink. Alternatively or in addition to measuring the heat flow, the temperature may also be measured at the surface acted upon by the heat flow and/or at a position predefined on the optical body. A surface adjacent to the heating body may, for example, be used on the optical body as the position predefined on the optical body. The temperature of the heating body can then be specified in a controlled and/or regulated manner using a look-up table and/or using a model, which comprise(s) a correlation of surface deformations, in particular of the surfaces acted upon by the heat flow, of the optical body, on the one hand, with the heat flow and/or the corresponding temperature data, on the other hand. By providing the heating body on that side of the optical body, which is arranged remote from the side from which the heat flow impingement takes place, a clear compensation is surprisingly produced of heat-induced deformations of the optical surface of the optical body. This may be achieved with a heating body which is exclusively actively heated and not actively cooled. A relative surface precision, in other words a ratio between a maximum surface deformation and a thickness of the optical body perpendicular to the optical surface thereof in the range of $10^{-7}$ to $10^{-8}$ can be achieved. Otherwise, the advantages of the method correspond to those which have already been stated above in conjunction with the temperature-control device according to the disclosure. The temperature specification of the heating body may, in particular, take place using a temperature regulation. In this case, the temperature of the heating body and/or for example the temperature at a surface of the optical element adjacent to the heating body is measured and the actual temperature is regulated to a predetermined desired temperature. The method can be carried out with a temperature-control device described herein.

In addition, a temperature of the heat sink may also be set and in particular regulated. As a result, a second degree of freedom is available which can be used to optimise the deformation compensation. The temperature of the heat sink may be set or predetermined as a constant temperature value.

A heat transfer between the heating mechanism and the heat sink can be set via the heat bridge and in particular set or predetermined in an adjustable manner. This may take place using a variable dimensioning of the heat bridge, for example using a variable contact cross-section of two heat bridge components. This also provides a further degree of freedom to optimise the deformation compensation.

A temperature profile may be set via the heating body. The advantages of a corresponding method correspond to those which have already been described above in conjunction with the temperature-control device.

BRIEF DESCRIPTION OF THE DRAWINGS

Embodiments are described in more detail below with the aid of the drawings, in which.

DETAILED DESCRIPTION

Figure 1:
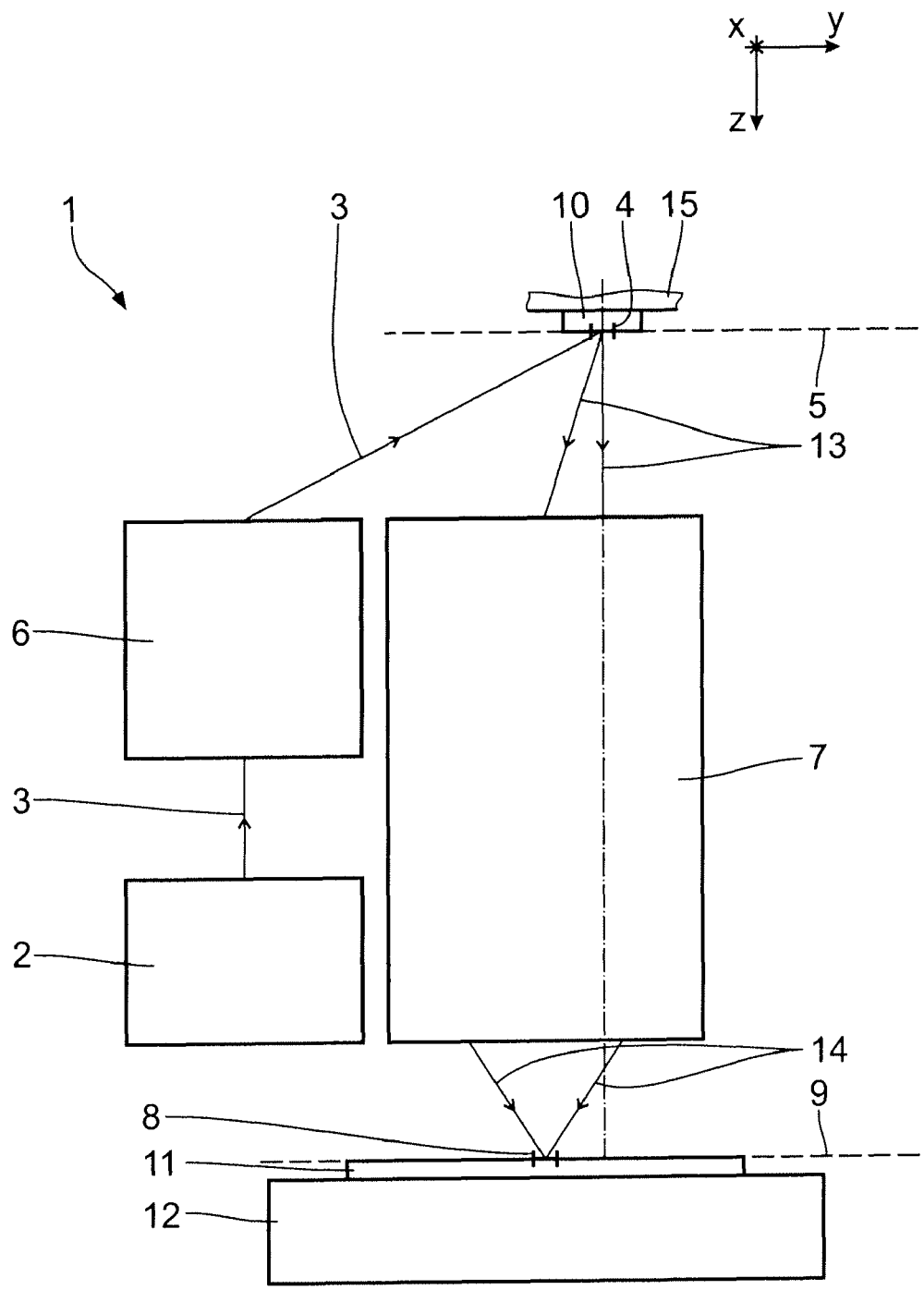
FIG. 1 schematically shows a projection exposure apparatus for EUV microlithography.

A projection exposure apparatus 1 for microlithography has a light source 2 for illumination light. The light source 2 is an EUV light source, which produces light in a wavelength range, in particular between 5 nm and 30 nm. Other EUV wavelengths are also possible. In general, even any desired wavelengths, for example visible wavelengths, are possible for the illumination light guided in the projection exposure apparatus 1. A beam bath of the illumination light 3 is shown very schematically in FIG. 1.

An illumination optics 6 is used to guide the illumination light 3 from the light source 2 to an object field 4 in an object plane 5. Using a projection optics 7, the object field 4 is imaged in an image field 8 in an image plane 9 at a predetermined reduction scale. One of the configurations known from the documents mentioned previously with regard to the known imaging optical systems can be used, for example, for the projection optics 7. The projection optics 7 reduces, for example, by a factor of 8. Other reduction scales are also possible, for example 4×, 5× or else reduction scales which are greater than 8×. An imaging scale of 8× is suitable, in particular, for the illumination light 3 with an EUV wavelength, as an angle of incidence on the object side can thereby be kept small on a reflection mask 10. An imaging scale of 8× in addition does not lead to the necessity of using unnecessarily large masks. The image plane 9 in the projection optics 7 may be arranged parallel to the object plane 5. A detail of the reflection mask 10, which coincides with the object field 4 and is also called a reticle, is imaged here.

The image field 8 is bent in a part circle shape, the spacing of the two part circle arcs 1 limiting the image field 8 being 1 mm. 1 mm is also the side length of the side edges extending straight and parallel to one another, limiting the image field 8 between the two part circle arcs. These two straight side edges of the image field 8 have a spacing from one another of 13 mm. This bent image field, with respect to its area, corresponds to a rectangular image field with the edge lengths 1 mm×13 mm. A rectangular image field 8 of this type is also possible.

The imaging takes place on the surface of a substrate 11 in the form of a wafer, which is carried by a substrate holder 12. FIG. 1 schematically shows, between the reticle 10 and the projection optics 7, a beam bundle 13 running therein, of the illumination light 3 and, between the projection optics 7 and the substrate 11, a beam bundle 14 running out of the projection optics 7, of the illumination light 3.

Figure 2:
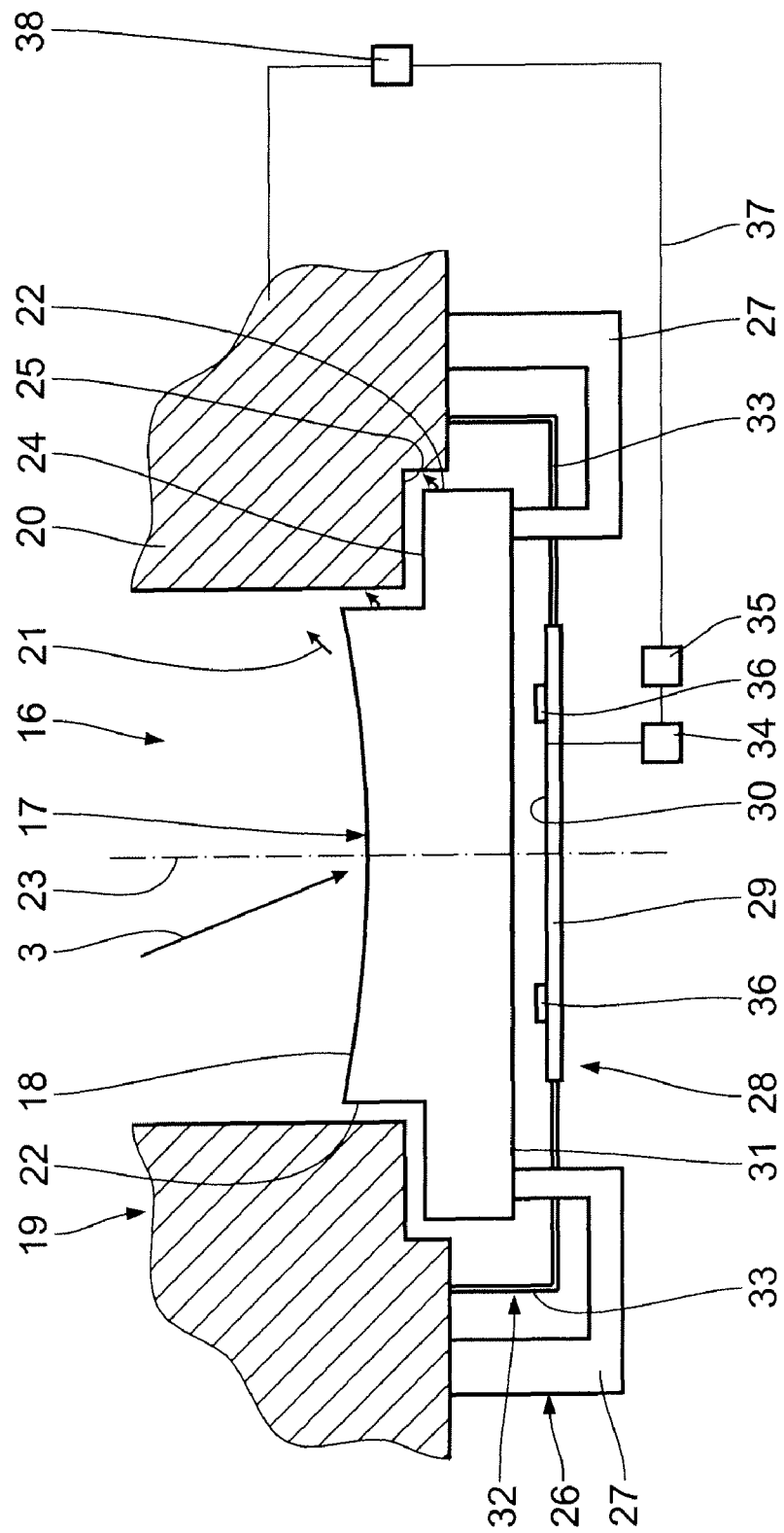
FIG. 2 shows an optical assembly of an illumination optics and/or a projection optics of the projection exposure apparatus according to FIG. 1 with a temperature-control device.

An image field-side numerical aperture of the projection optics 7 according to FIG. 2 is, for example 0.4. For graphical reasons this is not shown to scale in FIG. 1.

To facilitate the description of the projection exposure apparatus 1 and the various embodiments of the projection optics 7, a Cartesian xyz-coordinate system is given in the drawing, from which the respective positional relationship of the components shown in the figures is produced. In FIG. 1, the x-direction runs perpendicular to the plane of the drawing and into it. The y-direction runs to the right and the z-direction runs downward.

The projection exposure apparatus 1 is of the scanner type. Both a reticle holder 15, which carries the reticle 10, and the substrate holder 12 are scanned during operation of the projection exposure apparatus 1 in the y-direction.

FIG. 2 shows a cross-section of an optical assembly 16 with an optical body 17 in the form of a mirror to reflect the incident illumination or imaging light 3. The illumination light 3 is also designated below useful radiation. In addition to the useful radiation 3, further heat sources may act on the mirror 17. Included in these further heat sources are, for example, heat flows from mirror actuators and from sensors. The mirror 17 may be part of the illumination optics 6 or part of the projection optics 7 of the projection exposure apparatus 1. The illumination or imagining light 3 is reflected from an optical reflection surface 18 of the mirror 17. This reflection surface 18 has a multi-layer coating to maximise the reflection of the reflection surface 18 for the illumination or imaging light 3. In the case of EUV radiation as the illumination or imaging light 3, the degree of reflection of the reflection surface 18 is, for example, 0.7. In this case, apart from scattering losses, 30% of the energy of the illumination or imaging light 3 impinging on the reflection surface 18 is absorbed by the mirror 17.

A temperature-control device 19 for the mirror 17 is used to minimise the effects of the residual absorption of the useful radiation 3 in the mirror 17 on the forming or imaging quality of the reflection surface 18 during the reflection of the useful radiation 3, and, ideally, to eliminate it completely. Together with the mirror 17, the temperature-control mechanism 19 is part of the optical assembly 16.

The temperature-control device 19 has a heat sink 20 to receive a heat flow in the form of thermal radiation indicated in FIG. 2 by some arrows 21, which is emitted by the mirror 17. The heat sink 20 has the form of a hollow cylinder-like structure arranged around a peripheral region 22 of the reflection surface 18, the axis 23 of rotational symmetry of which structure coincides with an axis of symmetry of the reflection surface 18 or lies in a plane of symmetry of the reflection surface 18. A ratio between a diameter of the mirror 17 and a thickness of the mirror 17 along the axis 23 of rotational symmetry is about 5. The mirror 17 may have a diameter of 30 cm. The mirror thickness may be in the range between 5 and 10 cm. A lateral surface of the mirror 17 has a peripheral step 24. The periphery of the mirror 17 increase there and has, in the region of the reflection surface 18, a first smaller peripheral value up to a second larger peripheral value. The heat sink 20, in the region of the peripheral step 24, has a peripheral step 25 which is complementary to this, so that in the region of the reflection surface 18 and the mirror 17 adjacent thereto, the heat sink 20 is adjacent at a slight spacing to the shell wall of the mirror 17. There is no direct mechanical contact of the shell wall of the mirror 17 to the heat sink 20. The spacing between the mirror 17 and the heat sink 20 may be adjusted according to the respectively present structural situation and is generally between 1 mm and 5 mm. Basically larger or smaller spacing values are also possible.

The mirror 17 is mounted on the heat sink 20 using a holding structure 26. This holding structure 26 may be formed by a plurality of holding arms 27. The mounting of the mirror 17 to the holding structure 26 may be passive or else active, for example in the form of an actuator system, such as described, by way of example, in WO 2005/026 801 A or in US 2007/0076310 A.

The holding structure 26 is made of a practically non-heat conducting material, so that only a very low thermal coupling is present between the mirror 17 and the heat sink 20 via the holding structure 26. In the case of an actuator system according to WO 2005/026 801 A or US 2007/0076310 A1, the mirror 17 is thermally decoupled from the actuator. The holding structure 26 may be designed as a passive holding structure. In this case, it is formed using flexible elements, which produce a statically determined mounting. The holding structure 26 may have flexibility-producing constricted regions, which in turn contribute to a low thermal coupling. Invar may be used as the material for the holding structure 26.

The temperature-control device 19 also has a heating mechanism 28. This has a heating body 29 in the form of a, for example, metallic heating plate, covered with a heating foil 30. In the embodiment according to FIG. 2, the heating foil 30 completely covers the surface of the heating body 29 facing the mirror 17.

The heating body 29 is arranged adjacent to a rear side 31 of the mirror 17. The heating body 29 has a spacing in the range between 1 mm and 5 mm from the rear side 31 of the mirror 17. This spacing may basically also be selected to be larger or smaller.

The heating body 29 has the shape of a plate, the surface of which has approximately the same size as the reflection surface 18. The heating body 29 is arranged centred between the holding arms 27 of the holding structure 26.

As an alternative to a total covering of the heating body 29 with the heating foil 30, the heating foil may also be arranged in portions on the heating body surface, which surfaces the rear side 31 of the mirror 17. A structured embodiment of this type of the heating mechanism 28 allows the impressing of a corresponding heat structure by heat transmission from the heating body 29 to the mirror 17. Alternatively or in addition to a structured configuration of this type with heating foil portions, it is also possible to additionally arrange cooling portions on the side of the heating body 29 facing the rear side 31 of the mirror 17, so on the side of the heating body 29, which surfaces the mirror rear side 31, a temperature profile specified relative to a room temperature both in the positive and in the negative direction can be impressed. A portion-wise cooling can be implemented in that, apart from a region having heating foils, for example, a region with a thin additional plate is provided. This additional plate is, on the one hand, thermally decoupled from the heating body and, on the other hand, coupled by a good heat conductor to an additional regulated cooling body or coupled to an additional Peltier element.

The heating body 29 is connected via a physical heat bridge 32 to the heat sink 20 of the temperature-control device 19.

The heat bridge 32 is configured by a plurality of connecting webs 33 between the heating body 29 and the heat sink 20. In the peripheral direction about the axis 23 of rotational symmetry, the connecting webs 33 are arranged on different peripheral positions than the holding arms 27.

The cross-section and the material and also the number of connecting webs 33 is selected such that, with regard to a regulation of the temperature of the heating body 29 and a heating energy required to heat the heating body 29, an efficiency optimum is found. A very low heat coupling, in this context, leads to a system with a low required heating output. On the other hand, a very low heat coupling leads to a poorly controllable heating output. With a good heat coupling, the requirement of a large required heating output is produced, but this can then be well regulated.

The heating foil 30 is connected to a voltage source 34 for specifying the heating output of the heating foil 30. The voltage source 34 is activated by a regulating mechanism 35. The latter is in signal connection, in a manner not shown, with temperature sensors 36. The temperature sensors 36 are arranged distributed over the heating foil 30 and supply the regulating mechanism 35 with a signal representative of the temperature profile of the heating body 29 via the surface thereof. Using this signal, the regulating mechanism 35 activates the voltage source 34 to specify a corresponding heating output of the heating foil 30 to achieve a desired temperature value of the heating body 29. If the heating foil is divided into a plurality of heating foil portions or if the heating body 29, in addition to heating portions, also has cooling portions, a separate activation of these heating and cooling portions takes place via the regulating mechanism 35 to produce a correspondingly predetermined temperature profile of the heating body 29, which is then a temperature-control body. For example, the heating body 29 may be kept in portions at the predetermined temperature.

The heat sink 20 is in signal connection with the regulating mechanism 35 using a signal line 37 indicated schematically in FIG. 2 and a temperature-control element 38 for specifying a constant temperature of the heat sink 20, for example at a level of 22° C. The holder of the mirror 17 may be designed in accordance with that described in DE 101 34 387 A. In this case, the heat sink 20 may be implemented using a water cooling mechanism of a load structure. The temperature-control element 38 may also be designed as a Peltier element.

The total optical assembly 16 is located in a gas atmosphere, for example in a hydrogen atmosphere at a pressure of, for example 0.1 mbar. This provides a good thermal coupling of the mirror 17, on the one hand, to the heat sink 20 and, on the other hand, to the heating body 29.

In addition, the regulating mechanism 35 may be in signal connection with an optical sensor measuring the shape of the reflection surface 18 and/or the imaging quality in the image field 8 and/or the illumination quality in the object field 4. Depending on the parameters measured for the reflection surface shape and/or the imaging or the illumination quality, a corresponding specification of the temperature or the temperature profile of the heating body 29 may then take place, in that compensation of any thermal deformations of the reflection surface 18, which are responsible for deviations of measured shape parameters, imaging quality or illumination quality parameters from specified values, are compensated by a corresponding temperature-control of the mirror 17.

A correlation between a measured shape, imaging quality or illumination quality parameter and a temperature to be specified or a temperature profile to be specified of the heating body 29 may be detected in the course of a calibrating measurement and stored in a memory of the regulating mechanism 35. In this manner, a feed forward regulation of the temperature or of the temperature profile of the heating body 29 is possible with the aid of the regulating mechanism 35.

Since heat is emitted in a targeted manner via the heat bridge 32 from the heating body 29 to the heat sink 20, it is ensured that a temperature predetermined by the regulating mechanism 35 or a predetermined temperature profile can be rapidly adjusted using the heat transfer of the heating foil 30 or the heating foil portions.

In practice, it is sufficient if the heating body 29 is regulated to a temperature, which is, for example, 1° C. higher than the temperature at which the heat sink 20 is kept. Temperature differences of, for example 2° C., but also higher temperature differences are possible.

To produce a microstructured or nanostructured component, the projection exposure apparatus 1 is used as follows: firstly, the reflection mask 10 or the reticle and the substrate or the wafer 11 are provided. A structure on the reticle 10 is then projected onto a light-sensitive layer of the wafer 11 with the aid of the projection exposure apparatus 1. In this case, the quality of the exposure of the object field 4, on the one hand, and the quality of the imaging of the object 4 into the image field 8 are constantly measured with the aid of corresponding sensors. Heat transfer from the heating or temperature-control body 29 to the mirror 17 results and a corresponding thermal shaping according to the thermal longitudinal extension of the material of the mirror 17, which leads to a corresponding shape of the reflection surface 18. Depending on the measured shape parameters, exposure parameters or imaging quality parameters, the regulating mechanism 35 activates the voltage source 34 and optionally further heating or cooling sources to specify a temperature or a temperature profile of the heating or temperature-control body 29. Deviations of the exposure quality or the imaging quality from specified values can be compensated in this manner. After the projection exposure, a light-sensitive layer is developed on the wafer 11. As a result, the microstructured or nanostructured component is produced.

In the embodiment shown, the heat sink 20 is in heat-exchanging connection via the thermal radiation 21 directly with the mirror 17. Alternatively, it is possible that this thermal connection between the heat sink 20 and the mirror 17 is arranged using a transmission body. A transmission body of this type may, for example, be a mount of the mirror 17.

The temperature-control device 19 was described above in conjunction with the mirror 17 with a rotationally symmetrical reflection surface. Instead of a rotationally symmetrical system of this type, an optical assembly may also be present, which does not have a rotationally symmetrical axis and, in particular, no optical axis either. The reflection surface 18, in other words the optical surface, may not be circular in design, just like a support structure surrounding it, which forms the heat sink 20.

Figure 3:
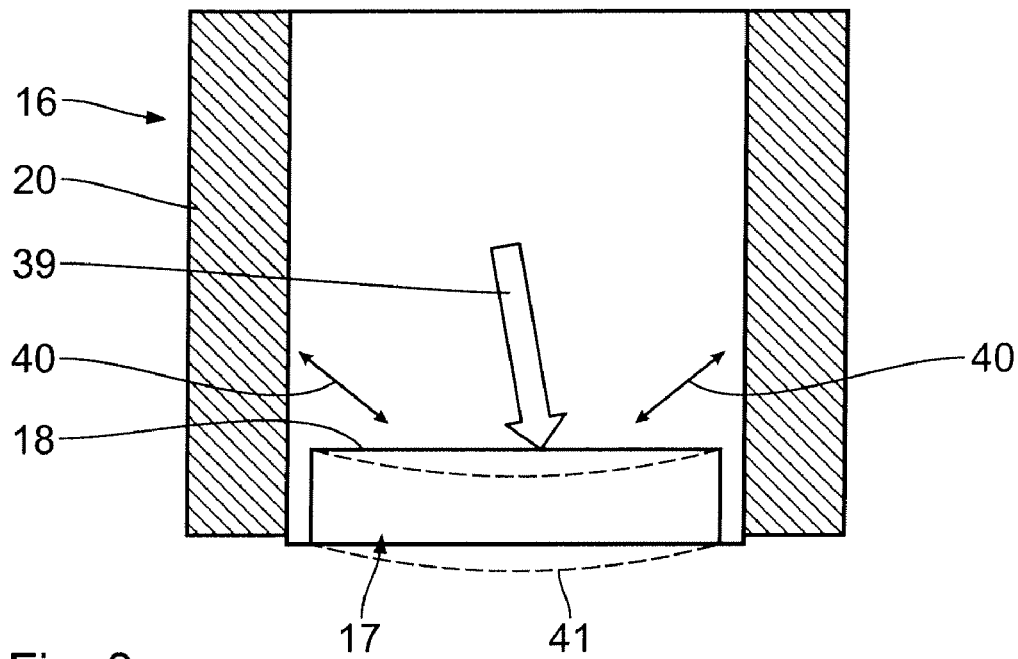
FIG. 3 schematically shows heat transmission conditions in the action upon a surface of an optical body of the optical assembly with a heat flow.
Figure 4:
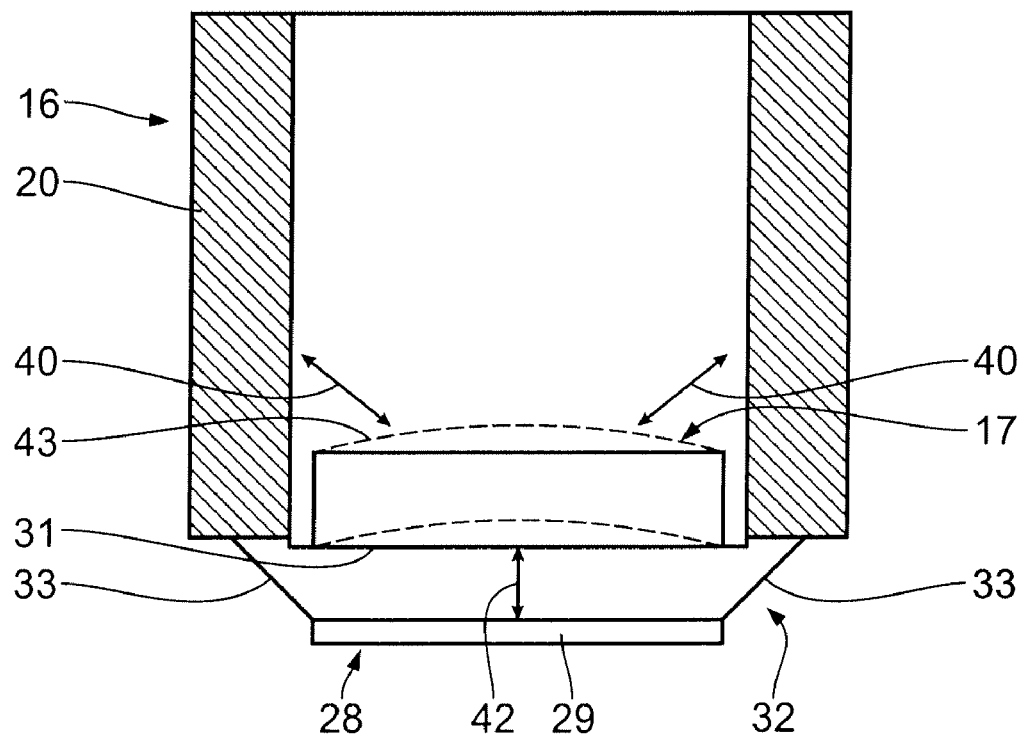
FIG. 4 shows the heat transmission conditions as a consequence of the action of a heating mechanism in a view similar to FIG. 3.

The heat transmission conditions for the optical assembly are illustrated schematically with the aid of FIGS. 3 and 4. FIG. 3 schematically shows the optical assembly 16 with the optical body 17 which is configured as a mirror and which is acted upon via its reflection surface 18 with a heat flow, which is designated 39 in FIG. 3. The periphery of the optical body 17 is surrounded by the hollow cylindrical heat sink 20. The optical body 17 and the heat sink 20 are shown in FIGS. 3 and 4 without the peripheral steps 24, 25 which are formed complementary with respect to one another.

As a consequence of the heat flow 39 acting upon the optical body 17, the optical body 17 heats up. A heat transmission by radiation or convection occurs between the optical body 17 and the heat sink 20, which is shown in FIG. 3 by double arrows 40. A negative heat transmission 40, in other words a heat flow from the optical body 17 onto the heat sink 20, is produced when the heat sink 20 has a lower temperature than the region of the optical body 17, from which the heat transmission 40 emanates. A positive heat transmission from the heat sink 20 to the optical body 17 is produced accordingly when the heat sink 20 has a higher temperature than the region of the optical body 17, from which the heat transmission 40 emanates.

Because of the heat flow 39, there is a deformation of the total optical body 17, which is shown by dashed lines in FIG. 3 at 41. This deformation 41, in other words without the action of the heating body 29, is about 1 nm (peak to peak value, peak to valley). Without a heat transmission between the heating mechanism 28 and the optical body 17, a heating of the optical body 17 is produced at the optical surface 18 of about 30° C. A temperature difference is produced between the temperature of the reflection surface 18 and the temperature of the rear side 31 of 3° C. The schematic view of a convex deformation of the optical body 17 in FIG. 3 is purely by way of example. A concave deformation could also result. Depending on the material of the optical body, the latter may have a coefficient of longitudinal elongation, which, in the operating temperature range, has a non-linear behaviour as a function of the temperature. In this case, depending on the operating temperature of the optical body 17 before the impinging of the heat flow 39, a convex deformation of the optical body 17 may also take place caused by the heat flow 39. In addition, the deformation also depends on the geometric shape of the optical body 17 and on the local distribution of the heat flow 39 on the optical body 17.

FIG. 4 shows the heat transmission conditions because of the effect of the heating mechanism 28. The connecting webs 33, which form the heat bridge 32 between the heating body 29 and the heat sink 20, are indicated schematically in FIG. 4. A weak thermal coupling of the heating body 29 to the heat sink 20 is brought about via the heat bridge 32.

Because of the fact that the temperature of the heating body 29 is greater than the temperature of the heat sink 20, a heat transmission is produced between the heating body 29 and the optical body 17, which is shown in FIG. 4 by a double arrow 42. The heat transmission 42 takes place by radiation or convection. The heat flow because of the heat transmission 42 may be negative if the heating body 29 has a lower temperature than the optical body on the rear side 31. The heat flow because of the heat transmission 42 may be positive if the heating body 29 has a higher temperature than the mirror body 17.

Because of the heat transmission 42, a deformation 43 of the optical body 17 is produced, which is shown by dashed lines in FIG. 4. The deformation 43 because of the effect of the heating mechanism 28 is directed counter to the deformation 41 because of the heat flow 39. By superimposing the two heat transmission states according to FIGS. 3 and 4 and at a temperature of the heating body 29 of 23° C., the resulting deformation of the optical body 17 is reduced as a result of the heat flow 39 by more than a factor of 10, in other words is then a maximum of 0.1 nm (peak to peak value, peak to valley). The deformation of the reflection surface 18 of the optical body 17 may, proceeding from the heat transmission situation according to FIG. 3, be reduced by a superimposition with the heat transmission situation according to FIG. 4, by the factor of 20.

Assuming a typical heat conductivity of the optical body 17, a temperature of 26° C. may be present at the reflection surface 18 and a temperature of 24° C. may be present at the rear side 31. It is to be noted here that on the reflection surface

18, the heat flow 39 acts relatively locally in the centre of the reflection surface 18. The heating mechanism 28 on the rear side 31 of the optical body 17, on the other hand, is effective practically over the entire surface of the rear side 31. In particular the temperature on the reflection surface 18 is therefore an average value. A direct correlation of temperatures on the reflection surface 18, on the one hand, and the rear side 31, on the other hand, can also be made more difficult by the fact that the optical body 17 may have a coefficient of elongation with varies with the temperature and in particular increases with the temperature.

A ratio between an achievable maximum deformation of 0.1 nm, with a mirror thickness of 1 cm, corresponds to a relative precision of the surface shape, which is also called accuracy of fit, of $10^{-8}$. An accuracy of fit in the range between $10^{-7}$ and $10^{-8}$ can be achieved by the temperature-control device 19.

The invention claimed is:

1. An optical assembly with a temperature-control device, the optical assembly comprising:
    at least one optical body with at least one surface which, during operation, is acted upon by a heat flow which is emitted from the optical body or from a transmission body in thermal connection with the optical body;
    a heat sink to receive the heat flow, the heat sink being arranged adjacent to a peripheral region of the optical surface; and
    a heating mechanism to correct deformations of the optical body, the heating mechanism comprising at least one heating body arranged adjacent to the optical body,
    wherein the heating body is connected to the heat sink by a physical heat bridge and has a temperature greater than or equal to a temperature of the heat sink, and
    the heat bridge is formed by at least one connecting web between the heating bodies and the heat sink.

2. The optical assembly of claim 1, wherein the at least one connecting web has a cross-sectional area which is greater than 1 mm$^2$.

3. The optical assembly of claim 2, wherein the at least one connecting web is formed from at least one of the following materials: aluminium, steel, invar or a ceramic composite material.

4. The optical assembly of claim 1, wherein the heating mechanism comprises a regulating mechanism for specifying a temperature profile via the heating body.

5. The optical assembly of claim 1, wherein the heating body comprises a heating foil.

6. The optical assembly of claim 1, wherein portions of the heating body are heated and/or cooled during operation.

7. The optical assembly of claim 1, wherein portions of the heating body are kept at a predetermined temperature during operation.

8. The optical assembly of claim 1, wherein the heat sink is in signal connection with a regulating mechanism to specify a constant temperature of the heat sink.

9. The optical assembly of claim 1, wherein the optical body is mounted with a holding structure, wherein the heat transmission of the holding structure is smaller than the heat transmission by the heat bridge between the heating body and the heat sink such that an interaction of heat transmission via the holding structure and via the heat bridge adjusts an efficiency optimum with regard to a regulation of a temperature of the heating body and a heating energy required to maintain the temperature to be regulated of the heating body.

10. The optical assembly of claim 1, wherein the at least one optical surface is arranged in a gas atmosphere.

11. The optical assembly of claim 1, wherein the optical body is a mirror, the heating mechanism being arranged adjacent to a rear side of the mirror remote from the optical surface of the mirror.

12. An illumination optics comprising an optical assembly according to claim 1.

13. A projection optics comprising an optical assembly according to claim 1.

14. A projection exposure apparatus comprising an illumination optics according to claim 12.

15. A projection exposure apparatus comprising a projection optics according to claim 13.

* * * * *

UNITED STATES PATENT AND TRADEMARK OFFICE
CERTIFICATE OF CORRECTION

PATENT NO. : 8,339,569 B2  
APPLICATION NO. : 13/049703  
DATED : December 25, 2012  
INVENTOR(S) : Armin Schoeppach et al.

Page 1 of 1

It is certified that error appears in the above-identified patent and that said Letters Patent is hereby corrected as shown below:

Cover Page Col. 1, Item (63),
(Related U.S. Application Data), delete "Sep. 14, 2008." and insert --Sep. 14, 2009.--

Signed and Sealed this
Fifth Day of March, 2013

Teresa Stanek Rea
*Acting Director of the United States Patent and Trademark Office*